United States Patent [19]

Young

[11] Patent Number: 4,885,472
[45] Date of Patent: Dec. 5, 1989

[54] SILICON GRID AS A REFERENCE AND CALIBRATION STANDARD IN A PARTICLE BEAM LITHOGRAPHY SYSTEM

[75] Inventor: Lydia J. Young, Palo Alto, Calif.

[73] Assignee: The Perkin-Elmer Corporation, Norwalk, Conn.

[21] Appl. No.: 167,601

[22] Filed: Mar. 14, 1988

[51] Int. Cl.$^4$ .................... G01H 21/00; G01D 18/00
[52] U.S. Cl. .............................. 250/491.1; 250/492.2; 250/252.1
[58] Field of Search .................... 250/491.1, 252.1 R, 250/492.24, 492.21; 430/327, 5

[56] References Cited

U.S. PATENT DOCUMENTS 4,517,465  5/1985  Gault et al. .................... 250/492.21
4,587,433  5/1986  Farley ............................ 250/492.21

OTHER PUBLICATIONS

Michel S. Michail, An Efficient Technique of Characterising Calibration Grids in E-Beam Lithography Tools, Sci. Instrum., vol. 16, 1983.

Shojiro Asai et al., Distortion Correction and Deflection Calibration by Means of Laser Interferometry in an Electron-Beam Exposure System, 10/28/79.

Primary Examiner—Bruce C. Anderson
Assistant Examiner—Michael Aronoff
Attorney, Agent, or Firm—Thomas P. Murphy; Paul A. Fattibene; Edwin T. Grimes

[57] ABSTRACT

A reference and calibration grid (44a or 44b) of silicon is incorporated into a particle beam lithography system (10) and used to calibrate the system (10). The grid (44a or 44b) is formed in a silicon die (50) of much thicker structure and with square holes (64) and with a period to enable direct coordination with binary electronics. The grid (44a or 44b) is coated with a suitable material, preferably gold (72), to prevent charged particles or electrons from passing through the solid portions of the grid and the grid is preferably mounted on a grid holder (52) which can be aligned to the X-Y reference on the workpiece stage (32) and may be adjusted in tilt and in height (Z direction). The crystallography of silicon provides accuracies in orthogonality, corner radii, and edge roughness required for grids used as fiducials for particle beam lithography. In addition, as part of a thicker structure (silicon die 50), the grid (44a or 44b) can easily be handled and hence mounting and alignment procedures can be markedly simplified. The flatness of the grid (44a or 44b) is consistent over the whole surface.

11 Claims, 3 Drawing Sheets

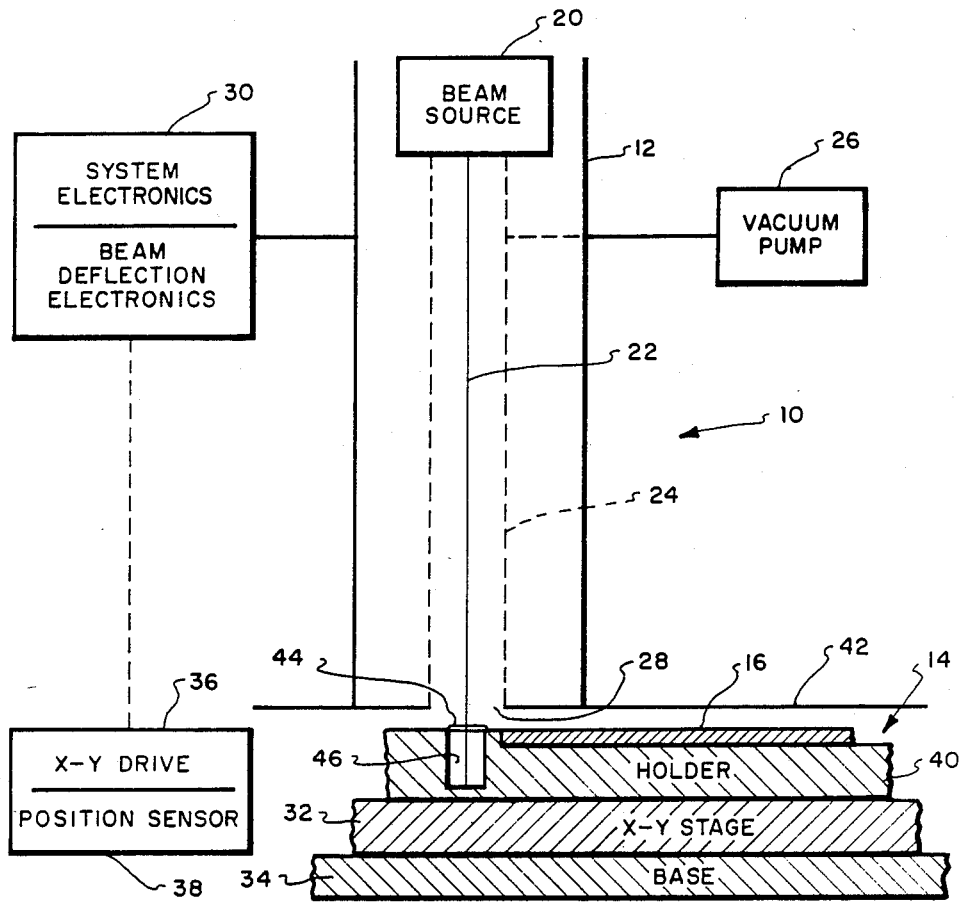
Fig. 1.
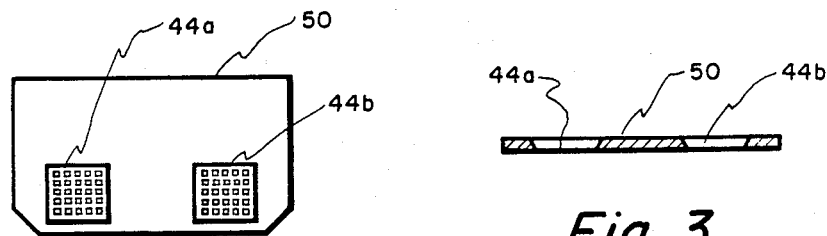
Fig. 2.
Fig. 3.

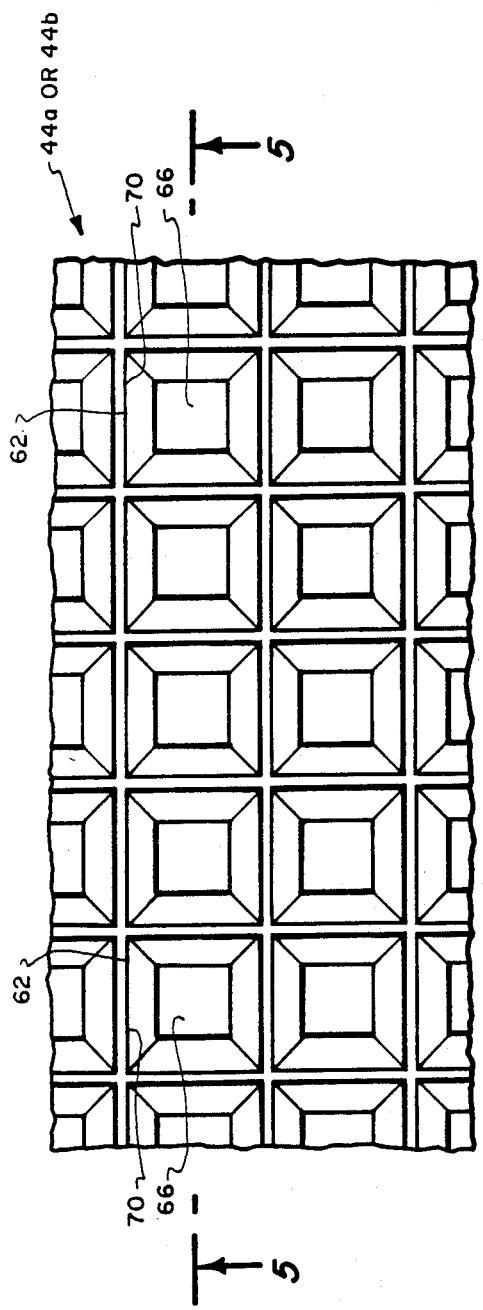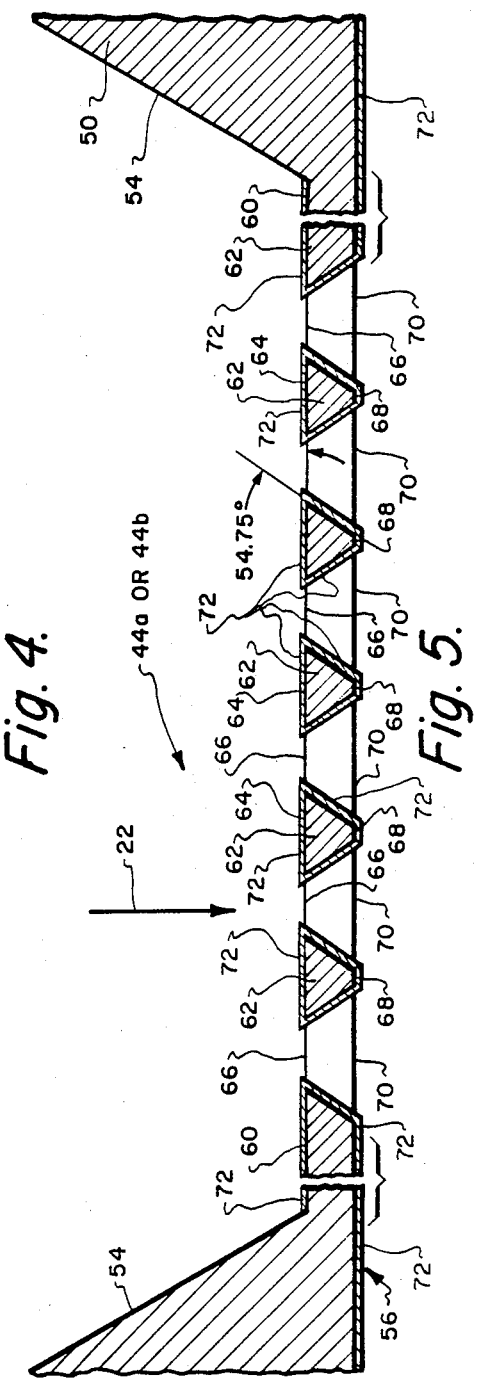

SILICON GRID AS A REFERENCE AND CALIBRATION STANDARD IN A PARTICLE BEAM LITHOGRAPHY SYSTEM

BACKGROUND OF THE INVENTION

This invention relates to an improvement in particle beam lithography systems used for processing a workpiece, such as a semiconductor wafer or mask, and particularly, to an improvement in the means for calibrating such systems.

Heretofore, in the prior art particle beam lithography systems, a reference and calibration grid of copper, connected to the X-Y stage, was used as a fiducial for calibrating such systems. The grid has essentially three functions: (a) to serve as a global reference location which is periodically used for the detection and quantification of stage drift over time, (b) as a reference for writing plane location, providing the particle beam column with a standard to focus upon, and (c) to serve as a reference to set up the particle beam column—to determine beam shape, beam current, beam uniformity, and beam rotation. The prior art copper grid was originally designed for use in a scanning electron microscope and then later used in particle beam lightography systems simply because it was convenient but the copper grid has a number of deficiences. The grid itself is fragile and quite small, and therefore difficult to handle, and the square holes have a period (center-to-center) of 63.5 microns which required extra calibration to be coordinated in a particle beam system having binary electronics. In addition, the corner radii of the square holes are typically several microns, on the order of the distance from the corner where the X-Y scans are made, and the edge roughness of the copper grids is variable and typically larger than a tenth of a micron. The orthogonality of adjacent grid bar edges in the copper grids is also variable and larger than the requirements of the lithography system. Finally, because of the thinness of the copper grids, these were difficult to mount with uniform flatness.

It is therefore a primary object of this invention to improve particle beam lithography systems by incorporating a reference and calibration grid into such systems which overcomes the deficiencies of the prior art calibration grids.

As used herein, the "grid" is that part of a larger structure, herein called a "silicon die", used for reference and calibration of the lithography system.

SUMMARY OF THE INVENTION

According to the present invention, a reference and calibration grid of silicon is incorporated into a particle beam lithography system and used to calibrate the system. The grid is formed in a silicon die of a much thicker structure and with square holes with a period to enable direct coordination with binary electronics. In the embodiment illustrated, the square holes are about 32 microns on a side with a period of about 64 microns for one type of particle beam lithography system but other dimensions are feasible in accordance to the needs of the particle beam lithography systems. The grid is coated with gold to present charged particles or electrons from passing through the solid portions, and is preferably mounted in a grid holder which may be adjusted in tilt and in height (Z direction) and can be aligned to the X-Y reference mirrors which are mounted on the workpiece stage.

From the following written description and drawings, it will be apparent that in this invention the crystallography of silicon provides accuracies in orthogonality, corner radii, and edge roughness required to define grids as fiducials for particle beam lithography. In addition, as part of a thicker silicon die, the grid can be easily handled and hence mounting and alignment procedures can be markedly simplified. Furthermore, the flatness of the grid is consistent over the whole surface and does not tend to warp as the copper grid did.

Other advantages of the invention will be apparent to those skilled in the art after having studied the accompanying drawings and the detailed description hereinafter.

BRIEF DESCRIPTION OF THE DRAWINGS

FIG. 1 is a schematic illustration of a particle beam lithography system incorporating the reference and calibration grid of the present invention and illustrates the particle beam positioned over the grid and Faraday cup, FIG. 2 is a plan view of the silicon die and two grids, FIG. 3 is a cross-sectional view of the silicon die and two grids, FIG. 4 is an enlarged plan bottom view showing in detail of part of one grid and the square holes, FIG. 5 is a partial cross-sectional view, also enlarged, taken along line 5—5 of FIG. 4, and showing the details of the grid bars and the sidewalls of the thicker silicon die.

DETAILED DESCRIPTION OF THE INVENTION

Figure 6:
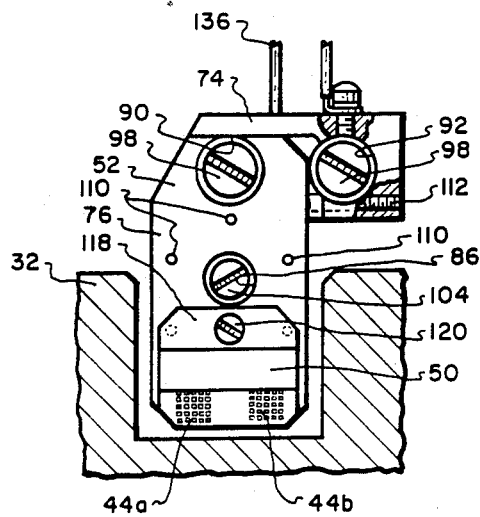
FIG. 6 is a plan view of the grids and grid holder and the means to align the grid holder to the stage.

As shown the schematic illustration, FIG. 1, the particle beam lithography system incorporating this invention is identified in its entirety as 10. The system includes a particle beam column 12 and workholding apparatus 14 upon which a workpiece 16 is loaded, processed and unloaded. The workpiece 16 is a semiconductor wafer or mask and is referred to as a substrate or simply a wafer.

As part of the beam column 12, there is provided an electron or ionized particle source 20, demagnification optics and projection and deflection optics which generate a finely focused beam 22 and may also include illumination and shaping objects when a shaped beam is utilized. A central tube 24 (shown in phantom) is within the column 12 and is traversed by the beam 22 and maintained at a high vacuum by a high vacuum pump 26 coupled to the column. The beam 22 passes through an aperture 28 in the column and impinges on the workpiece 16 for processing the latter. The complete lithography system further includes a computer (controller) and associated binary electronics which controls the beam 22, a drive system for driving the workholding apparatus and stores pattern data and provides beam control signals; all identified by a block diagram 30.

In the simplified schematic illustration of FIG. 1, the workholding apparatus 14 includes a conventional X-Y stage 32 on a stationary base 34 and is driven in the X-Y direction by a conventional X-Y drive 36. A position sensing system 38, including mirrors and interferometers, sense the position of the X-Y stage and feed back position information to the system electronics 30. Positioned on the X-Y stage 32 is a workpiece holder 40 for holding the workpiece 16 for processing by the beam 22 in the conventional manner. The workholding apparatus 14 may operate in a vacuum chamber schematically represented at 42 or may operate at atmosphere except in the vicinity of the aperture 28 as taught by the U.S. Pat. No. 4,528,451 or in the U.S. Application for Patent entitled "Differentially Pumped Seal Apparatus" by L.Young Ser. No. 062,038 filed 06/15/87.

As shown in this figure, a grid 44 and Faraday cup 46 are positioned on the X-Y stage 32 so that the grid 44 is coplanar with the top surface of the workpiece 16.

As mentioned above, the grid of this invention is an improvement over the prior art grids and is formed of silicon with precise dimensions which greatly simplifies the reference and calibration of the system.

Figure 7:
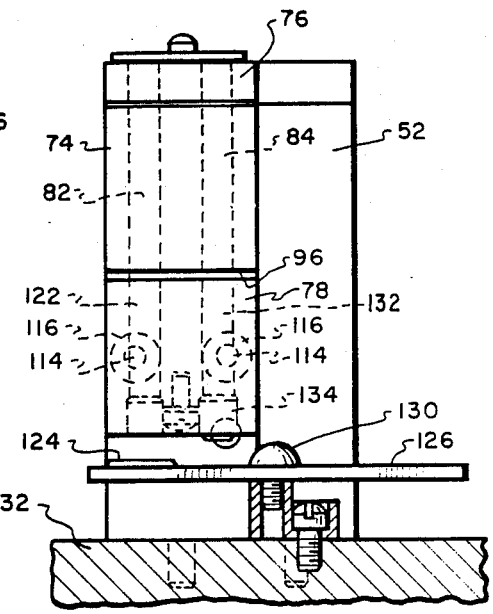
FIG. 7 is an elevational view of the grids and grid holder of FIG. 6.
Figure 8:
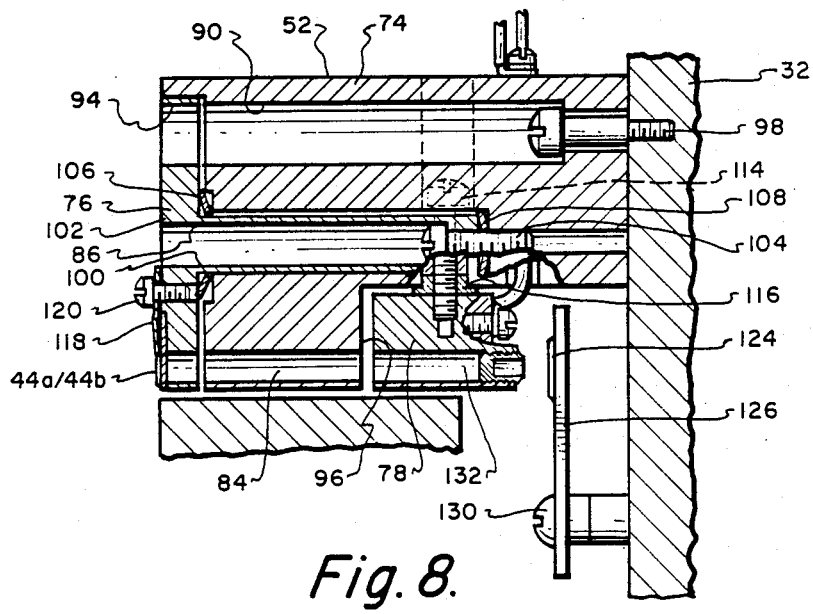
FIG. 8 is a cross-sectional view of the grids and grid holder of FIGS. 6 and 7.

FIGS. 2 and 3 show a relatively thick silicon die 50 (e.g., about 0.45 in ×0.25 in and about 300 microns thick) containing two grids 44a and 44b to be mounted on the gridholder 52 as shown in FIGS. 6-8. In the disclosed embodiment, two grids are shown for a particular application. As will be apparent to those skilled in the art, a single grid may be designed into the silicon die 50. The silicon die size is not important since the X-Y dimensions disclosed are for a particular application but other dimensions are feasible as will be apparent to those skilled in the art.

Each grid 44a, 44b, has tapered sidewalls 54 formed in the silicon die 50 and defining the grids as square (e.g. about 0.093 in on a side). The sidewalls 54 taper toward the bottom surface 56 of the silicon die 50 and terminate in rims 60 parallel to the top and bottom surfaces of the silicon die 50. The rims 60 also form an outer grid bar of a plurality of grid bars 62. As stated before, the dimensions disclosed are for a particular application but other dimensions are feasible as will be apparent to those skilled in the art.

As viewed in FIG. 5, the grid bars 62 are trapezoidal in cross section with their top bases 64 defining small square holes 66 and their bottom bases 68 defining larger square holes 70 at the bottom surface of the grid which are also coplanar with the bottom surface of the silicon die 50. Each trapezoid is about 20 microns thick (base to base) and the smaller square holes 66 are about 32 microns (e.g. 32 microns plus or minus 5 microns) on each side with a period of about 64 microns (e.g. 64 microns plus or minus 2 microns). Again, the precise dimensions are disclosed for one particular application and other dimensions are feasible as will be apparent to those skilled in the art.

To prevent charged particles or electrons from passing through the sidewalls and bases of the grid bar 62, the rim 60 and the sidewalls 54, all the surfaces thereof are plated with a suitable material, preferably gold at 72.

Before describing the grid holder 52 in detail, it should be pointed out that this grid holder 52 is capable of orienting the grid in the X,Y and Z direction and rotationally in the X-Y plane and represents one embodiment of such a grid holder 52. The purpose of the grid holder 52 is, of course, to properly orient the grid for reference and calibration purposes.

Turning now to FIGS. 6-8, it can be seen that the grid holder 50 comprises three parts; an elongated body member 74, a grid mounting plate 76 of table top-like configuration, and a Faraday cup body 78. The body member 74 contains two vertical parallel bores 82 and 84 near one end, a central vertical bore 86, two vertical bores 90 and 92 and two cut-away portions 94 and 96. The two bores 90 and 92 permit the body member to be attached to the X-Y stage 32 by suitable fastening means, bolts 98. The central bore 86 contains a vertical hollow sleeve 100 integral with and beneath the table top 102 of the grid mounting plate 76. The grid mounting plate 76 is fastened to the body member 74 by suitable means, bolt 104, through sleeve 100. The top 102 fits within the cut-away part 94 and has a first set of resilient spring type washers 106 at the top of the sleeve 100 beneath the table top 102 and a second set of resilient spring type washers 108 at the bottom of the sleeve to allow vertical adjustment (Z adjustment) of the grid mounting plate 76. Tilt adjustment of the grid mounting plate 76 is accomplished by three set screws 110 cooperating with the body member 74. Rotational adjustment on the grid mounting plate is accomplished by a pair of set screws 112 also cooperating with the body member 74.

The Faraday cup body 78 is attached to the body member 74 within the cut-away portion 96 by suitable means, bolt 114, and spaced from the walls of the cut-away portion 94 by bushings 116.

The silicon die 50 is clamped by suitable clamping means, clamp plate 118 and bolt 120, so that grids 44a and 44b are aligned with the vertical bores 82 and 84.

Grid 44a is also aligned with a vertical bore 122 in the Faraday cup body 78 and to a stage PIN diode detector 124 beneath the bore 82. Stage PIN diode detector 124 is mounted on a diode board 126 and the latter is suitably attached to the X-Y stage 32 by suitable means, bolt 130.

The grid 44b is aligned with bore 84 and with a vertical bore 132 in the Faraday cup body 80. The bore 132 is closed at its lower end by a set screw 134 so that the bore 132 becomes Faraday cup 46 as shown in FIG. 1 connected electrically by wire 136 to provide information signals to the system electronics.

Although two grids are shown on the silicon die 50, either the stage PIN diode detector 124 or the Faraday cup 46, may be used to receive the beam signal at the option of the user. The embodiment disclosed is for a particular application. Of course, the silicon die may also be provided with only one grid and the grid holder may be modified accordingly and the choice of beam detector is that of the user.

I claim:

1. In a particle beam lithography system having a beam column and particle beam directed toward a workpiece for processing a workpiece located on a X-Y stage, binary electronic means for deflecting said particle beam in an X and Y direction, means for driving said X-Y stage in an X and Y direction and means for sensing the position of the X-Y stage and sending signals of said stage position to said binary means, the improvement comprising,
   a reference and calibration grid having a plurality of square openings formed in a silicon die said grid being calibrated for direct coordination with the binary electronic system and said silicon die being much larger than said grid for easy handling and mounting in said system,
   means connecting said grid to said X-Y stage, and
   means cooperating with said grid to provide calibration signals whereby the grid may serve as a global reference location, as a reference for writing plane location and a reference to set up the particle beam column.

2. The system as claimed in claim 1 wherein said grid calibration comprises a plurality of square holes about 32 microns on a side with a period of about 64 microns.

3. The system as claimed in claim 2 wherein said grid is coated with a suitable metal to prevent charged particles from passing through the solid parts of said grid.

4. The system as claimed in claim 3 wherein said suitable metal is gold.

5. The system as claimed in claim 1 wherein said means cooperating with said grid comprises a PIN diode detector.

6. The system as claimed in claim 1 wherein said means cooperating with said grid comprises a Faraday cup.

7. In a particle beam lithography system having a beam column and particle beam directed toward a workpiece for processing a workpiece located on a X-Y stage, binary electronic means for deflecting said particle beam in an X and Y direction, means for driving said X-Y stage in an X and Y direction and means for sensing the position of the X-Y stage and sending signals of said stage position to said binary means, the improvement comprising, a reference and calibration grid having a plurality of square openings formed in a silicon die, said grid being calibrated for direct coordination with the binary electronic system, grid mounting means connected to said X-Y stage, adjustable in tilt and in the Z direction and may be aligned to X-Y reference mirrors mounted on the X-Y stage, and means cooperating with said grid to provide calibration signals whereby the grid may serve as a global reference location, as a reference for writing plane location and a reference to set up the particle beam column.

8. A die with at least one grid formed therein for reference in a particle beam lithography system having binary electronics for operating said system comprising, a silicon structure forming said die, said grid being smaller and thinner than said structure and having sidewalls that are trapezoidal in cross-section.

9. The die of claim 8 wherein said grid comprises a plurality of square holes of about 32 microns on a side with a period of about 64 microns.

10. The die of claim 9 wherein said grid is provided with a coating to prevent particle beams from passing through the solid portions of said grid.

11. The die of claim 10 wherein said coating is gold.

* * * * *